(12) United States Patent
Choi et al.

(10) Patent No.: US 10,446,628 B2
(45) Date of Patent: Oct. 15, 2019

(54) ORGANIC LIGHT-EMITTING DISPLAY APPARATUS

(71) Applicant: SAMSUNG DISPLAY CO., LTD., Yongin-si, Gyeonggi-Do (KR)

(72) Inventors: Jungmi Choi, Yongin-si (KR); Takahiro Senda, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 34 days.

(21) Appl. No.: 15/400,205

(22) Filed: Jan. 6, 2017

(65) Prior Publication Data

US 2017/0194402 A1 Jul. 6, 2017

(30) Foreign Application Priority Data

Jan. 6, 2016 (KR) .................. 10-2016-0001616

(51) Int. Cl.
*H01L 27/32* (2006.01)
*H01L 51/50* (2006.01)
*H01L 51/52* (2006.01)

(52) U.S. Cl.
CPC ...... *H01L 27/3248* (2013.01); *H01L 27/3211* (2013.01); *H01L 27/3246* (2013.01); *H01L 27/3262* (2013.01); *H01L 27/3265* (2013.01); *H01L 27/3276* (2013.01); *H01L 51/5012* (2013.01); *H01L 51/5218* (2013.01); *H01L 51/5234* (2013.01); *H01L 2251/5315* (2013.01)

(58) Field of Classification Search
CPC ............ H01L 27/3248; H01L 51/5012; H01L 51/5218; H01L 51/5234
See application file for complete search history.

(56) References Cited

U.S. PATENT DOCUMENTS

| | | | |
|---|---|---|---|
| 9,105,589 B2* | 8/2015 | Bang | H01L 27/32 |
| 2008/0116463 A1* | 5/2008 | Ito | H01L 51/5203 257/72 |
| 2008/0143247 A1 | 6/2008 | Kim et al. | |
| 2011/0220898 A1* | 9/2011 | Yoon | H01L 27/1214 257/59 |
| 2014/0374704 A1* | 12/2014 | Jang | H01L 51/0097 257/40 |
| 2016/0211307 A1* | 7/2016 | Kim | H01L 51/5225 |
| 2016/0254337 A1* | 9/2016 | Choi | H01L 27/3272 257/40 |
| 2016/0329393 A1* | 11/2016 | Seo | H01L 27/3262 |

FOREIGN PATENT DOCUMENTS

| | | |
|---|---|---|
| JP | 2015-088425 | 5/2015 |
| KR | 10-2008-0055243 | 6/2008 |
| KR | 10-2015-0069278 | 6/2015 |
| KR | 10-2015-0071319 | 6/2015 |

* cited by examiner

*Primary Examiner* — Dung A. Le
(74) *Attorney, Agent, or Firm* — F. Chau & Associates, LLC

(57) ABSTRACT

An organic light-emitting display apparatus includes a pixel electrode with at least one opening; an intermediate layer disposed on the pixel electrode that includes an organic emission layer; an opposite electrode disposed on the intermediate layer; and a driving circuit that includes an upper conductive layer that overlaps the at least one opening of the pixel electrode in a plan view, and that is electrically connected to the pixel electrode.

7 Claims, 6 Drawing Sheets

ORGANIC LIGHT-EMITTING DISPLAY APPARATUS

CROSS-REFERENCE TO RELATED APPLICATION

This application claims priority under 35 U.S.C. § 119 from, and the benefit of, Korean Patent Application No. 10-2016-0001616, filed on Jan. 6, 2016 in the Korean Intellectual Property Office, the contents of which are herein incorporated by reference in their entirety.

BACKGROUND

1. Technical Field

One or more embodiments are directed to an organic light-emitting display apparatus.

2. Discussion of the Related Art

An organic light-emitting display apparatus is a self-emission display apparatus that includes a plurality of organic light-emitting devices (OLEDs), each including a hole injection electrode, an electron injection electrode, and an organic emission layer therebetween. Holes injected from the hole injection electrode recombine with electrons injected from the electron injection electrode in the organic emission layer to produce excitons. These excitons decay from an excited state to a ground state, thereby emitting light.

As a self-emission display apparatus, an organic light-emitting display apparatus requires no separate light source. Thus, an organic light-emitting display apparatus can be driven at low voltages and is light weight and has a slim profile. In addition, an organic light-emitting display apparatus has a wide viewing angle, a high contrast ratio, and a short response time. Accordingly, an organic light-emitting display apparatus is widely used in various fields, such as personal portable devices such as MP3 players or mobile phones, televisions, etc.

Organic light-emitting display apparatuses that enable a user to recognize not only an image displayed by the organic light-emitting display apparatus but also an outside background have been studied.

SUMMARY

One or more embodiments of the disclosure can provide an organic light-emitting display apparatus that has improved image quality by reducing an influence of current generated from a parasitic capacitor to an organic light-emitting device.

According to one or more embodiments, an organic light-emitting display apparatus includes: a pixel electrode that includes at least one opening; an intermediate layer disposed over the pixel electrode that includes an organic emission layer; an opposite electrode disposed over the intermediate layer; and a driving circuit that includes an upper conductive layer that overlaps the at least one opening of the pixel electrode in a plan view, and that is electrically connected to the pixel electrode.

According to one or more embodiments, the pixel electrode may be a reflective electrode, and the opposite electrode may be a transparent or translucent electrode.

According to one or more embodiments, the pixel electrode may include a reflective layer that completely surrounds the at least one opening.

According to one or more embodiments, the driving circuit may further include a lower conductive layer disposed below the upper conductive layer that overlaps the at least one opening in a plan view, and the upper conductive layer and the lower conductive layer may be electrically connected to each other.

According to one or more embodiments, the driving circuit may further include at least one thin film transistor (TFT) and at least one capacitor, and the upper conductive layer and the lower conductive layer may correspond to a node to which the at least one TFT and the at least one capacitor are connected.

According to one or more embodiments, the at least one TFT may include: an active layer; a gate electrode disposed on the active layer and insulated from the active layer; and a source electrode and a drain electrode disposed on the gate electrode. The drain electrode may be electrically connected to the active layer, and the upper conductive layer may be a part of the source electrode.

According to one or more embodiments, the at least one capacitor may include: a first electrode disposed on a same layer as the gate electrode; and a second electrode disposed on different layer from the source electrode that is opposite to the first electrode with an insulating layer therebetween. The source electrode may be electrically connected to the second electrode through a contact hole in the insulating layer, and the lower conductive layer may be a part of the second electrode.

According to one or more embodiments, an organic light-emitting display apparatus includes: a pixel disposed on a substrate that includes a first area in which an image is displayed and a second area through which external light passes. The pixel includes: a driving circuit disposed in the first area that drives the pixel and includes at least one upper conductive layer; a pixel electrode disposed in the first area that is electrically connected to the driving circuit and includes at least one opening; a pixel-defining layer disposed in at least the first area that includes a first opening that exposes a part of the pixel electrode and a second opening that corresponds to the second area; an intermediate layer disposed on the pixel electrode that is exposed by the first opening and includes an organic emission layer; and an opposite electrode disposed on the intermediate layer. The at least one opening and the at least one upper conductive layer overlap in a plan view.

According to one or more embodiments, the pixel electrode may be a reflective electrode, and the opposite electrode may be a transparent or translucent electrode.

According to one or more embodiments, the pixel electrode may include a reflective layer that completely surrounds the at least one opening.

According to one or more embodiments, the driving circuit may further include a lower conductive layer disposed below the at least one upper conductive layer that overlaps the at least one opening in a plan view, and the at least one upper conductive layer and the lower conductive layer may be electrically connected to each other.

According to one or more embodiments, the driving circuit may further include at least one thin film transistor (TFT) and at least one capacitor, and the at least one upper conductive layer and the lower conductive layer may correspond to a node to which the at least one TFT and the at least one capacitor are connected.

According to one or more embodiments, the at least one TFT may include: an active layer; a gate electrode disposed on the active layer and insulated from the active layer; and a source electrode and a drain electrode disposed on the gate electrode wherein the drain electrode is electrically connected to the active layer. The at least one upper conductive layer may be a part of the source electrode.

According to one or more embodiments, the at least one capacitor may include: a first electrode disposed on a same layer as the gate electrode; and a second electrode disposed on different layer from the source electrode that is opposite to the first electrode with an insulating layer therebetween. The source electrode may be electrically connected to the second electrode through a contact hole in the insulating layer, and the lower conductive layer may be a part of the second electrode.

According to one or more embodiments, the at least one TFT may be a switching TFT and the at least one capacitor may be a storage capacitor. The driving circuit may further include a driving TFT that overlaps the storage capacitor in a plan view.

According to one or more embodiments, a ratio of the second area with respect to an entire area of the pixel may range from about 40% to about 90%.

According to one or more embodiments, an organic light-emitting display apparatus includes: a pixel disposed on a substrate that includes a first area in which an image is displayed and a second area through which external light passes. The pixel includes: a driving circuit disposed in the first area that drives the pixel and includes at least one upper conductive layer; and a pixel electrode disposed in the first area that is electrically connected to the driving circuit and includes at least one opening. The pixel comprises a first sub-pixel, a second sub-pixel, and a third sub-pixel that emit light of different colors, and wherein the pixel electrode comprises a first pixel electrode, a second pixel electrode, and a third pixel electrode respectively disposed in the first sub-pixel, the second sub-pixel, and the third sub-pixel. At least one of the first pixel electrode, the second pixel electrode, and the third pixel electrode comprises the at least one opening, and at least one of the first pixel electrode, the second pixel electrode, and the third pixel electrode does not comprise the at least one opening. The at least one opening and the at least one upper conductive layer overlap in a plan view.

According to one or more embodiments, the organic light-emitting display apparatus may further include: a pixel-defining layer disposed in at least the first area that includes a first opening that exposes a part of the pixel electrode and a second opening that corresponds to the second area; an intermediate layer disposed on the pixel electrode that is exposed by the first opening and includes an organic emission layer; and an opposite electrode disposed on the intermediate layer.

According to one or more embodiments, the first pixel electrode, the second pixel electrode, and the third pixel electrode may respectively emit red light, green light, and blue light and may have different areas.

According to one or more embodiments, the organic light-emitting display apparatus may further include: a laser drilling area disposed adjacent to the first sub-pixel of the first area that includes an auxiliary electrode disposed on a same layer as the pixel electrode and connected to the opposite electrode.

DETAILED DESCRIPTION

Figure 1:
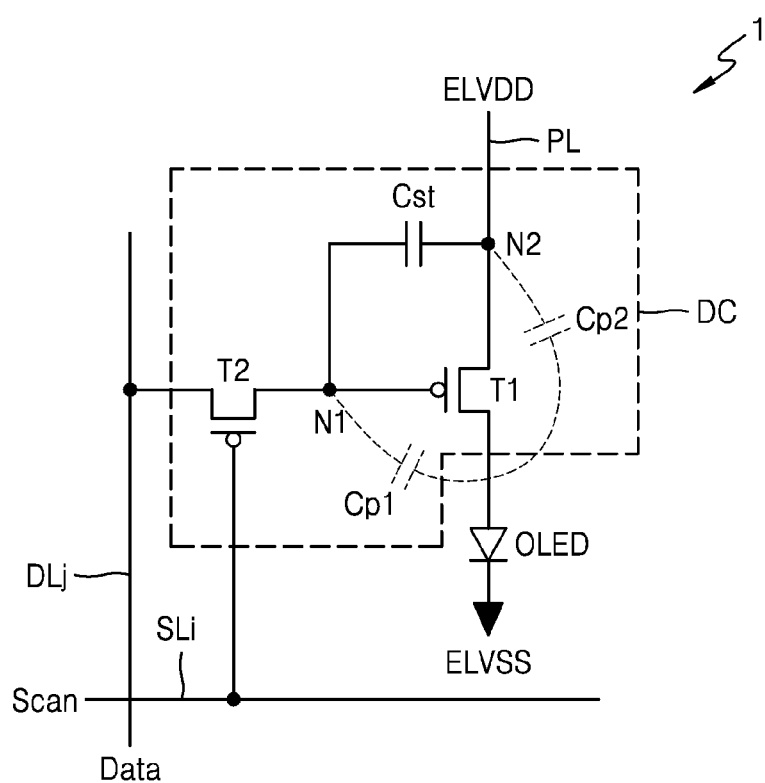
FIG. 1 is an equivalent circuit diagram of one pixel of an organic light-emitting display apparatus according to an embodiment.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein.

Hereinafter, embodiments of the present disclosure will be described in detail by explaining exemplary embodiments of the disclosure with reference to the attached drawings. Like reference numerals in the drawings may denote like elements, and thus their description may be omitted.

In the following description, when a layer is described to exist "on" or "above" another layer, the layer may exist directly on the other layer or a third layer such as a film, an area, or a constituent element may be interposed therebetween.

Also, in the drawings, the thickness or size of each layer illustrated in the drawings may be exaggerated for convenience of explanation and clarity.

An organic light-emitting display apparatus according to an embodiment can be implemented as a top emission type organic light-emitting display apparatus that includes a pixel electrode that is a reflective electrode and an opposite electrode that is a transparent or translucent electrode and emits light from an emission layer through the opposite electrode.

According to embodiments, a top emission type organic light-emitting display apparatus, a pixel circuit that includes a thin film transistor, etc., is disposed below the pixel electrode to achieve a maximum opening ratio, and when the pixel electrode overlaps a conductive layer in the pixel circuit in a plan view, a parasitic capacitor may occur.

According to embodiments, a parasitic capacitor can cause errors in the driving current supplied to an organic light-emitting device, which can deteriorate the quality of an image displayed by an organic light-emitting display apparatus.

Figure 2:
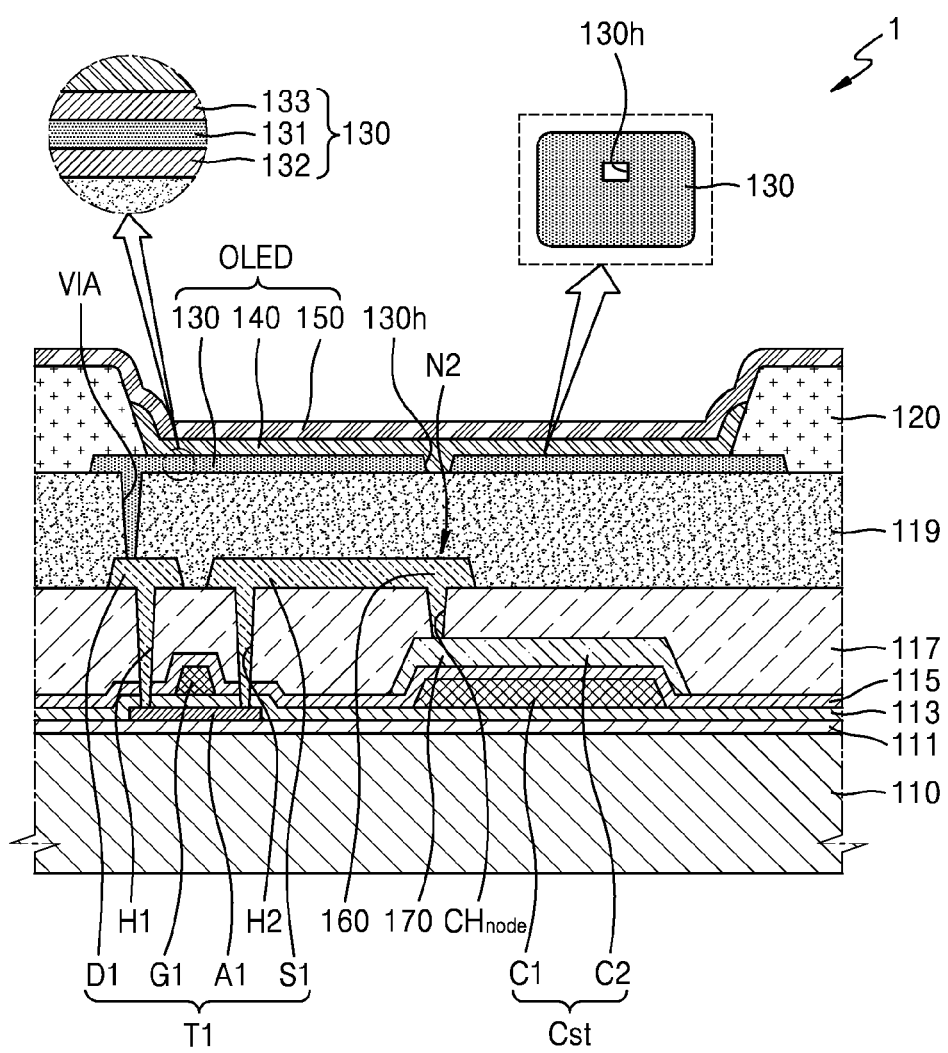
FIG. 2 is a cross-sectional view of an organic light-emitting display apparatus according to an embodiment.

FIG. 1 is an equivalent circuit diagram of one pixel of an organic light-emitting display apparatus 1 according to an embodiment. FIG. 2 is a cross-sectional view of the organic light-emitting display apparatus 1 according to an embodiment.

Referring to FIGS. 1 and 2, the organic light-emitting display apparatus 1 according to an embodiment includes a pixel electrode 130 with at least one opening 130h, an intermediate layer 140 disposed over the pixel electrode 130 that includes an organic emission layer, an opposite electrode 150 disposed over the intermediate layer 140, and a driving circuit DC that includes an upper conductive layer 160 overlapping the at least one opening 130h of the pixel electrode 130 in a plan view and electrically connected to the pixel electrode 130.

According to an embodiment, the pixel electrode 130, the intermediate layer 140, and the opposite electrode 150 constitute an organic light-emitting device OLED. The driving circuit DC drives the organic light-emitting device OLED by adjusting the intensity of current supplied to the organic light-emitting device OLED.

According to an embodiment, the pixel electrode 130 is a reflective electrode, and the opposite electrode 150 may be a transparent or translucent electrode. Thus, light emitted from the intermediate layer 140 may be emitted out through the opposite electrode 150. That is, the organic light-emitting display apparatus 1 is a top emission type device. A top emission type organic light-emitting display apparatus 1 does not display an image in a direction of a substrate 110 and includes the driving circuit DC between the pixel electrode 130 and the substrate 110 to improve an opening ratio of the organic light-emitting display apparatus 1.

That is, according to an embodiment, the driving circuit DC overlaps the pixel electrode 130 in a plan view.

According to an embodiment, an opening ratio, which refers to the area in the organic light-emitting display apparatus 1 from which light is emitted, can be improved. In addition, the pixel electrode 130 and conductive layers in the driving circuit DC overlap in a plan view, and thus an unintended capacitor can be formed.

According to an embodiment, the pixel electrode 130 is a reflective electrode and includes at least one reflective layer 131 selected from a group that includes Ag, Mg, Al, Pt, Pd, Au, Ni, Nd, Ir, Cr, or a compound thereof. According to an embodiment, the pixel electrode 130 further includes transparent or translucent electrode layers 132 and 133 disposed above and/or below the reflective layer 131.

According to an embodiment, the pixel electrode 130 in the organic light-emitting display apparatus 1 includes at least one opening 130h. That is, the pixel electrode 130 includes at least one opening 130h and the reflective layer 131 completely surrounding the at least one opening 130h. Thus, the pixel electrode 130 has a donut shape that includes the opening 130h therein. According to an embodiment, the opening 130h may have various shapes, such as a circle or a rectangle.

According to an embodiment, when the pixel electrode 130 includes only the reflective layer 131, the reflective layer 131 includes the at least one opening 130h. When the pixel electrode 130 includes the reflective layer 131 and the transparent or translucent electrode layers 132 and 133, the reflective layer 131 and the transparent or translucent electrode layers 132 and 133 all include the at least one opening 130h.

According to an embodiment, the driving circuit DC includes an upper conductive layer 160 that overlaps the at least one opening 130h in a plan view. The upper conductive layer 160 may be one of the conductive layers included in a thin film transistor (TFT) or a capacitor that is included in the driving circuit DC.

According to an embodiment, the upper conductive layer 160 be separated from the pixel electrode 130 by a fourth insulating layer 119 therebetween and may form a parasitic capacitor with the pixel electrode 130. However, according to an embodiment, the pixel electrode 130 includes the opening 130h that overlaps at least a part of the upper conductive layer 160, which can prevent or reduce parasitic capacitance from being generated in an area of the at least one opening 130h.

According to an embodiment, a lower conductive layer 170 that overlaps the pixel electrode 130 in a plan view is disposed below the upper conductive layer 160. A third insulating layer 117 is disposed between the lower conductive layer 170 and the upper conductive layer 160.

According to an embodiment, the third insulating layer 117 includes a node contact hole $CH_{node}$ that connects the upper conductive layer 160 and the lower conductive layer 170. That is, the opening 130h formed in the pixel electrode 130 is disposed in an area corresponding to the node contact hole $CH_{node}$. The lower conductive layer 170 may be one of conductive layers included in a TFT or a capacitor that is included in the driving circuit DC.

Referring to FIG. 1, according to an embodiment, the driving circuit DC includes at least one TFT and at least one capacitor. The at least one TFT and/or the at least one capacitor are electrically connected to lines SLi, DLj, and PL that transmit a scan signal Scan, a data signal Data, or a driving voltage ELVDD to the driving circuit DC. The driving circuit DC according to an embodiment includes two TFTs T1 and T2 and one capacitor Cst, but embodiments are not limited to those numbers of TFTs and capacitors. The two TFTs T1 and T2 can be a driving TFT T1 and a switching TFT T2. The capacitor Cst mis a storage capacitor Cst.

According to an embodiment, the switching TFT T2 includes a gate electrode connected to a scan line SLi, a source electrode connected to a data line DLj, and a drain electrode connected to a first node N1. The switching TFT T2 is turned on by the scan signal Scan received from the scan line SLi to transmit the data signal Data received from the data line DLj through the source electrode to the first node N1.

According to an embodiment, the driving TFT T1 includes a gate electrode connected to the first node N1, a source electrode connected to a power line PL that supplies a first driving voltage ELVDD, and a drain electrode connected to the pixel electrode 130 of the organic light-emitting device OLED. The driving TFT T1 can be turned on or off by a voltage of the first node N1 to control the current supplied to the organic light-emitting device OLED.

According to an embodiment, the storage capacitor Cst connects the power line PL and the first node N1, stores a voltage corresponding to a voltage difference between the first driving voltage ELVDD and the first node N1, and maintains the voltage for a predetermined time.

According to an embodiment, the pixel electrode 130 of the organic light-emitting device OLED is connected to the driving circuit DC. A second driving voltage ELVSS is applied to the opposite electrode 150. The organic light-emitting device OLED emits light having a predetermined brightness corresponding to the current received from the driving circuit DC. According to an embodiment, the organic light-emitting device OLED emits red light, green light, blue light, or white light.

As described above, according to an embodiment, the pixel electrode 130 of the organic light-emitting device OLED overlaps the driving circuit DC in a plan view. In this case, parasitic capacitor can be generated between conductive layers in the devices forming the driving circuit DC and the pixel electrode 130. According to an embodiment, a first parasitic capacitor Cp1 is formed between the first node N1 to which the switching TFT T2 and the storage capacitor Cst are connected and the pixel electrode 130. A second parasitic capacitor Cp2 is formed between a second node N2 to which the storage capacitor Cst and a source electrode S1 of the driving TFT T1 are connected and the pixel electrode 130. In addition, a parasitic capacitor is formed where conductive layers in the organic light-emitting display apparatus 1 overlap in a plan view. These parasitic capacitors can generate errors in a magnitude of the current supplied to the organic light-emitting device OLED, which can deteriorate the quality of an image displayed by the organic light-emitting display apparatus 1.

According to an embodiment, to minimize the influence of the parasitic capacitors on the current, the opening 130h is formed in a region of the pixel electrode 130 that has the greatest influence on the current, thereby minimizing deterioration in quality of the image displayed by the organic light-emitting display apparatus 1.

Referring to FIG. 2, according to an embodiment, a buffer layer 111 is disposed over the substrate 110. The substrate 110 includes glass or plastic. The buffer layer 111 includes an inorganic material such as silicon nitride $SiN_x$ and/or silicon oxide $SiO_2$ in a single layer structure or a double layer structure. The buffer layer 111 prevents impurities from penetrating into the driving circuit DC from the substrate 110 and planarizes a surface of the substrate 110.

According to an embodiment, the driving TFT T1 and the storage capacitor Cst are disposed over the buffer layer 111. The driving TFT T1 includes an active layer A1 disposed over the buffer layer 111, a gate electrode G1 insulated from the active layer A1, and a source electrode S1 and a drain electrode D1 that are respectively connected to the active layer A1 through a first contact hole H1 and a second contact hole H2. A first insulating layer 113 is disposed between the active layer A1 and the gate electrode G1. A second insulating layer 115 and the third insulating layer 117 are disposed over the first insulating layer 113 and cover the gate electrode G1.

According to an embodiment, the gate electrode G1 includes one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer structure or a multi-layer structure.

According to an embodiment, the source electrode S1 and the drain electrode D1 include one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer structure or a multi-layer structure. According to an embodiment, the source electrode S1 and the drain electrode D1 are configured in a triple layer of Mo/Al/Mo or Ti/Al/Ti.

According to an embodiment, the storage capacitor Cst disposed over the buffer layer 111 includes a first electrode C1 and a second electrode C2 opposite to the first electrode C1. The first electrode C1 includes the same material and is disposed on the same layer as the gate electrode G1. The second insulating layer 115 is between the first electrode C1 and the second electrode C2. According to an embodiment, the second electrode C2 is disposed on a different layer from the source electrode S1 and the drain electrode D1 and includes one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer structure or a multi-layer structure.

According to an embodiment, the third insulating layer 117 is disposed over the second electrode C2 of the storage capacitor Cst. The second electrode C2 is connected to the source electrode S1 of the driving TFT T1 through the node contact hole $CH_{node}$ in the third insulating layer 117. That is, the node contact hole $CH_{node}$ corresponds to the second node N2 of FIG. 1.

According to an embodiment, the fourth insulating layer 119 is disposed over the third insulating layer 117 and covers the source electrode S1 and the drain electrode D1. The organic light-emitting device OLED, which includes the pixel electrode 130, the intermediate layer 140, and the opposite electrode 150, and a pixel-defining layer 120 that covers an edge of the pixel electrode 130, are disposed on the fourth insulating layer 119. The pixel electrode 130 is connected to the drain electrode D1 of the driving TFT T1 through a via hole VIA in the fourth insulating layer 119.

According to an embodiment, the pixel electrode 130 includes the opening 130h that corresponds to the node contact hole $CH_{node}$. As described above, the node contact hole $CH_{node}$ corresponds to the second node N2 of FIG. 1, and the opening 130h is formed in the pixel electrode 130 to remove or reduce the parasitic capacitance Cp2 due to the overlapping of the second node N2 and the pixel electrode 130.

According to an embodiment, the upper conductive layer 160 that overlaps the opening 130h in the pixel electrode 130 in a plan view is a part of the source electrode S1 of the driving TFT T1, and the lower conductive layer 170 disposed below the upper conductive layer 160 is a part of the second electrode C2 of the storage capacitor Cst. That is, the upper conductive layer 160 corresponds to an area, i.e. the second node N2, in which the node contact hole $CH_{node}$ is disposed in the source electrode S1 of the driving TFT T1, and the lower conductive layer 170 corresponds to the second electrode S2 of the storage capacitor Cst.

However, embodiments of the present disclosure are not limited thereto. The upper conductive layer 160 and the lower conductive layer 170 may be different layers of the driving circuit DC.

Figure 3:
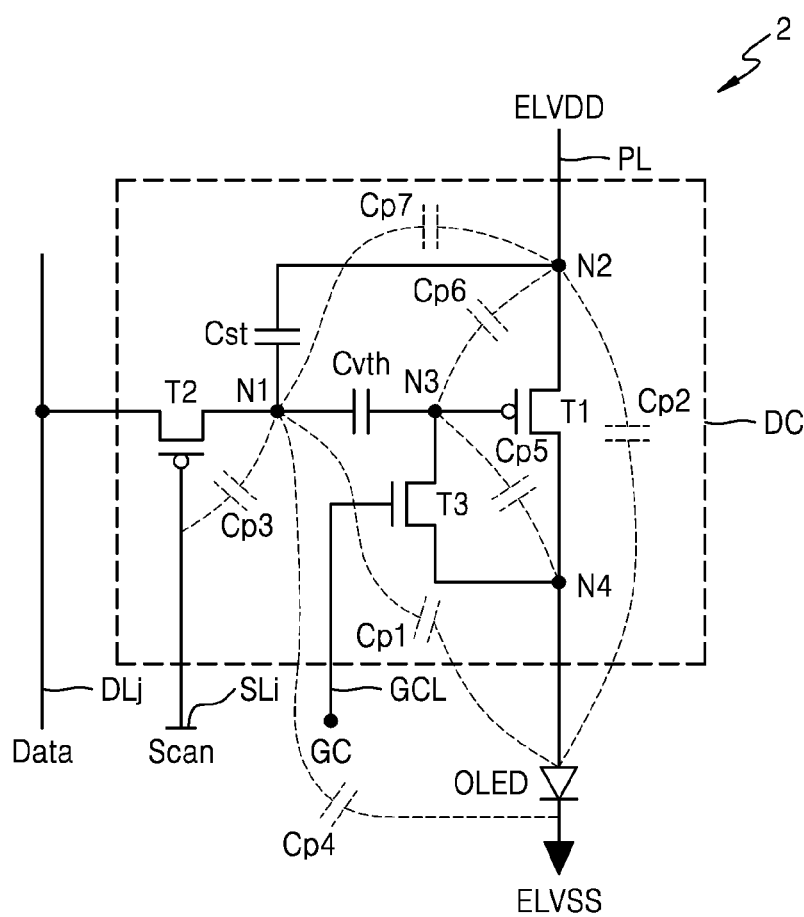
FIG. 3 is an equivalent circuit diagram of one sub-pixel of an organic light-emitting display apparatus according to another embodiment.

FIG. 3 is an equivalent circuit diagram of one sub-pixel of an organic light-emitting display apparatus 2 according to another embodiment.

Referring to FIG. 3, the organic light-emitting display apparatus 2 according to another embodiment includes a plurality of pixels that can display an image. Each of the plurality of pixels includes a plurality of sub-pixels that emit light of different colors. Each of the plurality of sub-pixels include the organic light-emitting device OLED and the driving circuit DC that drives the organic light-emitting device OLED. The driving circuit DC includes at least one TFT and at least one capacitor. The at least one TFT and/or the at least one capacitor are electrically connected to the plurality of lines SLi, DLj, and PL that transmit the scan signal Scan, the data signal Data, and the driving voltage ELVDD to the driving circuit DC. The driving circuit DC according to an embodiment includes three TFTs T1, T2, and T3 and two capacitors Cst and Cvth, but embodiments are not limited to those numbers of TFTs and capacitors.

According to an embodiment, the TFTs T1, T2, and T3 include the driving TFT T1, the switching TFT T2, and a compensation TFT T3. The capacitors Cst and Cvth include the storage capacitor Cst and a compensation capacitor Cvth.

According to an embodiment, the switching TFT T2 includes a gate electrode connected to the scan line SLi, a source electrode connected to the data line DLj, and a drain electrode connected to the first node N1. The switching TFT T2 can be turned on by the scan signal Scan transmitted by the scan line SLi to transmit the data signal Data received from the data line DLj through the source electrode to the first node N1.

Figure 4:
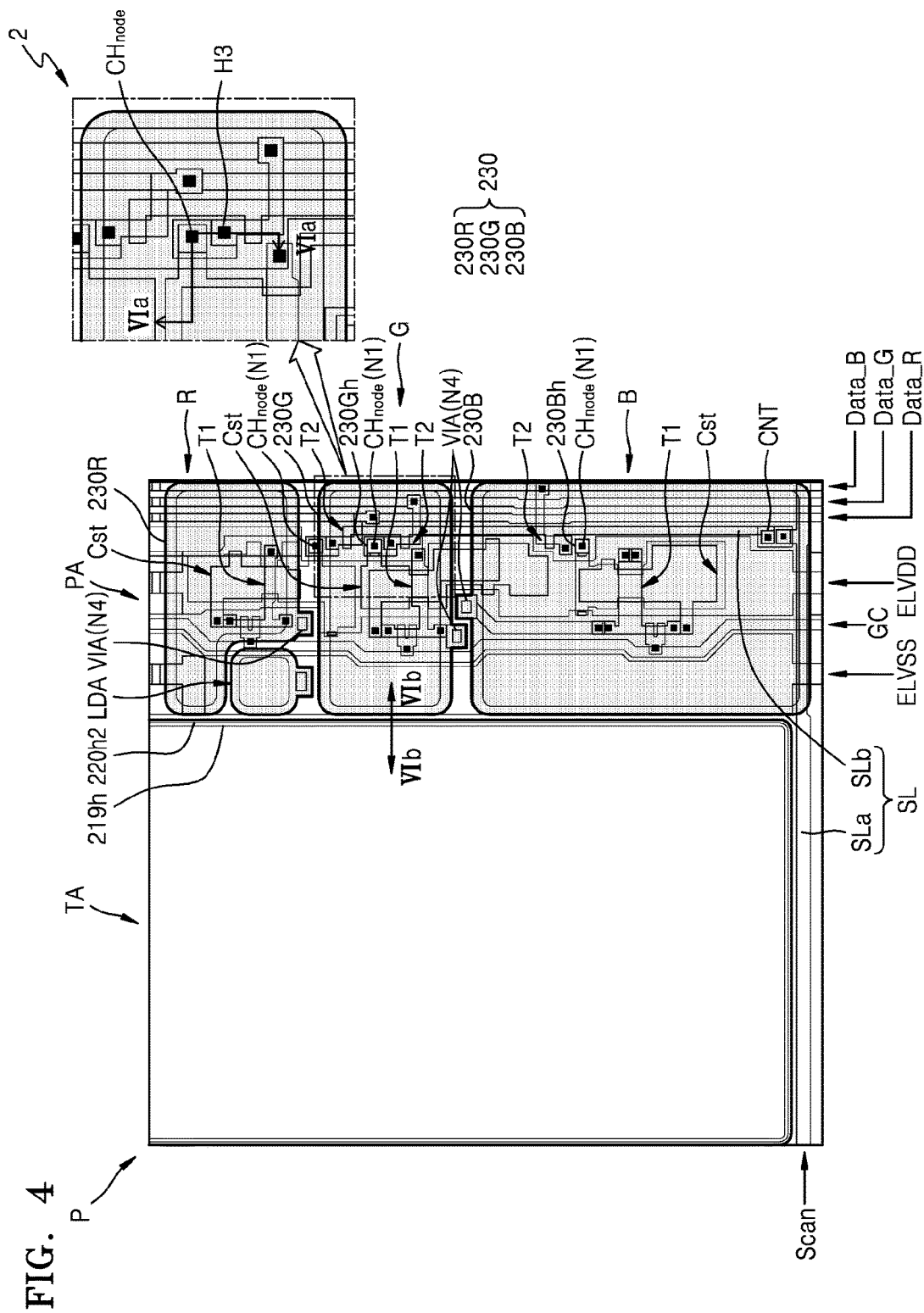
FIG. 4 is a plan view of one pixel in an organic light-emitting display apparatus that includes a plurality of sub-pixels according to another embodiment.

According to an embodiment, the driving TFT T1 includes a gate electrode connected to a third node N3, a source electrode connected to the power line PL that supplies the first driving voltage ELVDD, and a drain electrode connected to a pixel electrode 230 of FIG. 4 of the organic light-emitting device OLED. The driving TFT T1 can be turned on or off by a voltage of the third node N3 to control current supplied to the organic light-emitting device OLED.

According to an embodiment, the compensation TFT T3 includes a gate electrode connected to a compensation control line GCL that supplies a compensation control signal GC, a drain electrode connected to the third node N3, and a source electrode connected to the pixel electrode 230 of FIG. 4 of the organic light-emitting device OLED and the drain electrode of the driving TFT T1, i.e. a fourth node N4. When the compensation TFT T3 is turned on by the compensation control signal GC applied to the gate electrode of the compensation TFT T3, the driving TFT T1 is diode-connected through the compensation TFT T3.

According to an embodiment, the compensation capacitor Cvth is connected between the first node N1 and the third node N3. The storage capacitor Cst is connected between the first node N1 and the second node N2. The storage capacitor Cst can store a voltage that corresponds to a voltage difference between the first node N1 and the second node N2 and can maintain the voltage for a predetermined time. The compensation capacitor Cvth, along with the compensation TFT T3, can compensate a threshold voltage Vth of the driving TFT T1.

According to an embodiment, the pixel electrode 230 of FIG. 4 of the organic light-emitting device OLED is connected to the driving circuit DC. The second driving voltage ELVSS is applied to an opposite electrode 250 of FIG. 6. The organic light-emitting device OLED can emit light having a predetermined brightness corresponding to the current received from the driving circuit DC. According to an embodiment, the organic light-emitting device OLED can emit red light, green light, blue light, or white light.

According to an embodiment, the organic light-emitting display apparatus 2 is a top emission type device. The pixel electrode 230 of FIG. 4 of the organic light-emitting device OLED and the driving circuit DC overlap in a plan view. In this case, a parasitic capacitance can be generated between conductive layers in the devices forming the driving circuit DC and the pixel electrode 230 of FIG. 4. A parasitic capacitance can also be generated between conductive layers of the driving circuit DC.

According to an embodiment, the first parasitic capacitor Cp1 is formed between the first node N1 to which the switching TFT T2 and the storage capacitor Cst are connected and the pixel electrode 230 of FIG. 4. The second parasitic capacitor Cp2 is formed between the second node N2 to which the storage capacitor Cst and the driving TFT T1 are connected and the pixel electrode 230 of FIG. 4. In addition, parasitic capacitors Cp3, Cp4, Cp5, Cp6, and Cp7 are formed at locations where conductive layers in the organic light-emitting display apparatus 2 overlap in a plan view.

According to an embodiment, these parasitic capacitors can generate errors in the current supplied to the organic light-emitting device OLED, which can deteriorate the quality of an image displayed by the organic light-emitting display apparatus 2.

According to an embodiment, to minimize an influence of the parasitic capacitors on the current, openings 230Gh and 230Bh of FIG. 4 are formed in regions of the pixel electrode 230 of FIG. 4 that have the greatest influence on the current, to minimize the deterioration in quality of the image displayed by the organic light-emitting display apparatus 2.

Figure 5:
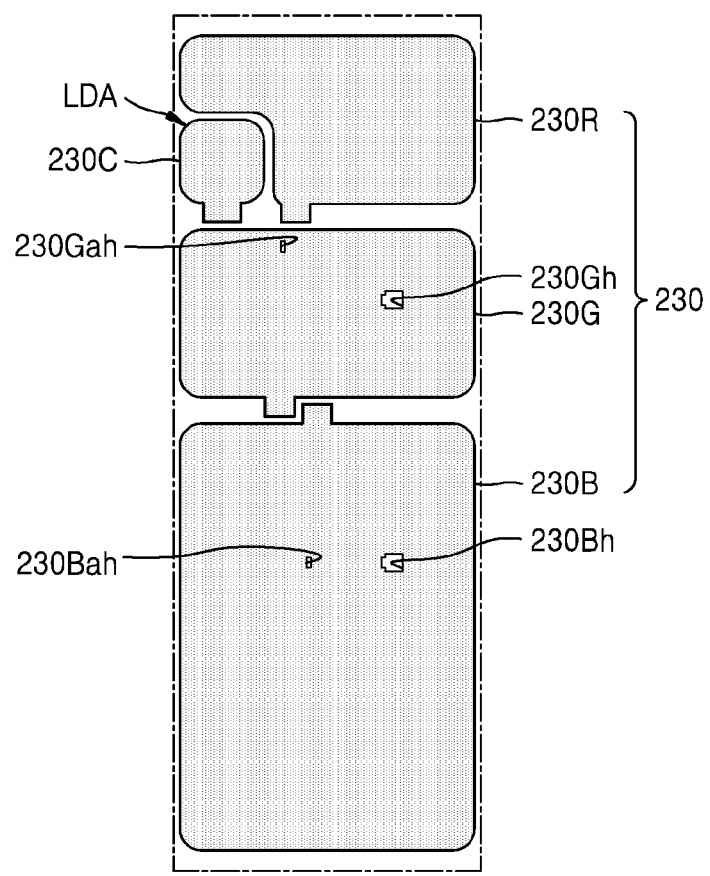
FIG. 5 is a plan view of a pixel electrode in an organic light-emitting display apparatus of FIG. 4.
Figure 6:
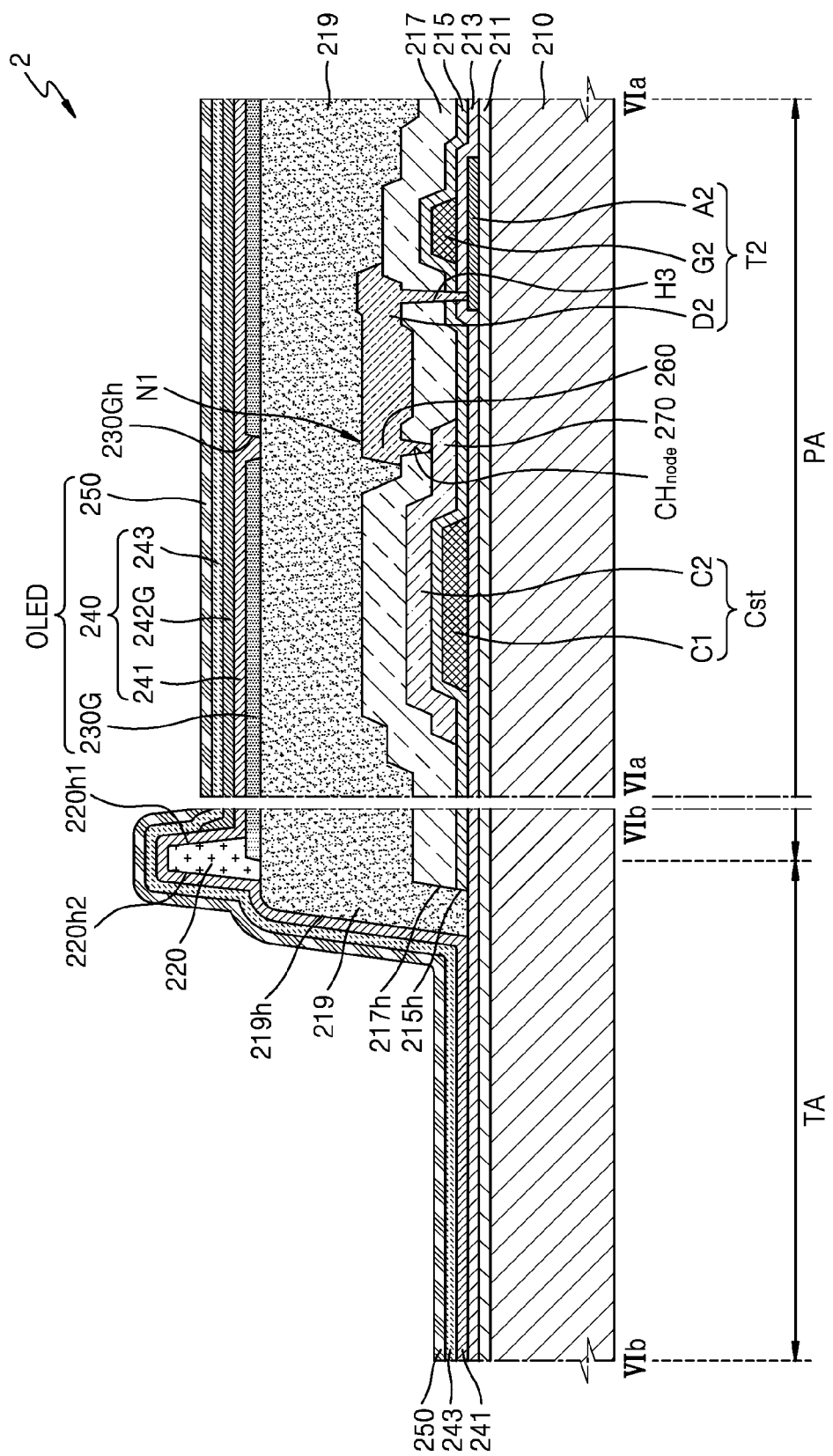
FIG. 6 is a cross-sectional view taken along lines VIa-VIa and VIb-VIb of FIG. 4.

FIG. 4 is a plan view of one pixel P included in the organic light-emitting display apparatus 2 that includes a plurality of sub-pixels according to another embodiment. FIG. 5 is a plan view of the pixel electrode 230 included in the organic light-emitting display apparatus 2 of FIG. 4. FIG. 6 is a cross-sectional view taken along lines VIa-VIa and VIb-VIb of FIG. 4.

Referring to FIGS. 4 through 6, the organic light-emitting display apparatus 2 according to an embodiment includes a substrate 210 and the pixel P disposed over the substrate 210, and comprises a first area PA for displaying an image and a second area TA through which external light passes. The pixel P includes the driving circuit DC disposed in the first area PA that drives the pixel P, at least one upper conductive layer 260, pixel electrodes 230G and 230B disposed in the first area PA that are electrically connected to the driving circuit DC that respectively include at least one opening 230Gh and at least one opening 230Bh, a pixel-defining layer 220 disposed at least in the first area PA that includes a first opening 220h1 that exposes part of the pixel electrode 230G and a second opening 220h2 corresponding to the second area TA, an intermediate layer 240 disposed over the pixel electrode 230G exposed by the first opening 220h1 that includes an organic emission layer 242G, and the opposite electrode 250 disposed over the intermediate layer 240. The at least one opening 230Gh overlaps the upper conductive layer 260 in a plan view.

According to an embodiment, the organic light-emitting display apparatus 2 includes a plurality of pixels that include the first area PA through which light is emitted and the second area TA through which external light passes. External light may refer to light that is incident to the organic light-emitting display apparatus 2 and may be perceived by a user after passing through the organic light-emitting display apparatus 2. That is, a user located at a side on which an image is displayed can view a background behind the organic light-emitting display apparatus 2 through the organic light-emitting display apparatus 2. That is, the organic light-emitting display apparatus 2 can be implemented as a transparent display apparatus.

According to an embodiment, the organic light-emitting display apparatus 2 is a top emission type device in which an image is displayed in a direction opposite from the substrate 210 of the organic light-emitting display apparatus 2. Each of the plurality of pixels includes the first area PA and the second area TA and displays an image from the first area PA and transmits external light through the second area TA. The second area TA is connected to the plurality of pixels.

According to an embodiment, a device that includes an opaque metal, such as a TFT, a capacitor, an organic light-emitting device, etc., is not disposed in the second area TA, to increase the transmittance of external light through the second area TA.

According to an embodiment, a first sub-pixel R, a second sub-pixel G, and a third sub-pixel B that emit light of different colors are disposed in the first area PA that respectively emit red light, green light, and blue light. However, embodiments are not limited thereto. Any combination of colors is possible if such combination can form white light.

According to an embodiment, each of the first sub-pixel R, the second sub-pixel G, and the third sub-pixel B can be driven by the driving circuit DC of FIG. 3. According to an embodiment, at least a part of the driving circuit DC overlaps pixel electrodes 230R, 230G, and 230B respectively included in the first sub-pixel R, the second sub-pixel G, and the third sub-pixel B in a plan view. That is, at least a part of the driving circuit DC is between the substrate 210 and the pixel electrode 230, to improve an opening ratio and transmittance of the organic light-emitting display apparatus 2.

According to an embodiment, the first sub-pixel R, the second sub-pixel G, and the third sub-pixel B are disposed along a first direction. At least one line extends along a second direction crossing the first direction. The line may be a scan line, a data line, and/or a power line. According to an embodiment, the line extending along the second direction is the scan line SLi that transmits the scan signal Scan, but embodiments are not limited thereto. The scan line SLi includes a first portion SLa disposed adjacent to the first area PA and the second area TA that extends along the second direction, and a second portion SLb disposed in the first area PA that extends along the first direction. The first portion SLa and the second portion SLb of the scan line SLi are disposed on different layers and are electrically connected to each other by a contact portion CNT.

According to an embodiment, the data line DLj of FIG. 3 respectively transmits data signals Data_R, Data_G, and Data_B to the first sub-pixel R, the second sub-pixel G, and the third sub-pixel B. A first power line PL of FIG. 3, a second power line, and the compensation signal line GCL of FIG. 3 that respectively transmit the first driving voltage ELVDD, the second driving voltage ELVSS, and the compensation signal GC are disposed in the first area PA and extend along the first direction.

According to an embodiment, the second area TA is a transparent area through which light externally incident to one surface of the substrate 210 passes through the organic light-emitting display apparatus 2 and to be perceived by a user. A reflective electrode, an opaque line, etc., may not be disposed in the second area TA. The second area TA can be partitioned by an opaque line or an opaque electrode. According to an embodiment, the second area TA can be defined as an area between two adjacent, spaced apart opaque lines. The second area TA can be defined as an area in which the pixel electrode 230 is not disposed. When the pixel-defining layer 220 includes a light absorbing material, the second area TA can be defined as an area in which the second opening 220h2 is disposed.

According to an embodiment, a ratio of the area of the second area TA with respect to an entire area of one pixel P can range from about 40% to about 90%. When the area ratio of the second area TA is less than about 40%, to the transmittance of external light is reduced, which reduces the ability of the organic light-emitting display apparatus 2 to function as a transparent display apparatus. As the area of the second area TA increases, the transmittance of the organic light-emitting display apparatus 2 increases, but since the first area PA that displays an image needs to be secured, an area ration of the second area TA with respect to one pixel P should not exceed about 90%.

According to an embodiment, the first pixel electrode 230R, the second pixel electrode 230G, and the third pixel electrode 230B respectively disposed in the first sub-pixel R, the second sub-pixel G, and the third sub-pixel B have different areas. A laser drilling area LDA is disposed in an area adjacent to the first sub-pixel R.

According to an embodiment, an auxiliary electrode 230C inn the same layer as the pixel electrode 230 is disposed in the laser drilling area LDA and is connected to the opposite electrode 250 to reduce a voltage drop of the opposite electrode 250.

FIG. 5 illustrates the pixel electrode 230 and the auxiliary electrode 230C disposed in the same layer as the pixel electrode 230 in the laser drilling area LDA of the one pixel P of FIG. 4.

According to an embodiment, the pixel electrode 230 includes the pixel electrodes 230R, 230G, and 230B respectively disposed in the first sub-pixel R, the second sub-pixel G, and the third sub-pixel B. According to an embodiment, the pixel electrodes 230G and 230B respectively included in the second sub-pixel G and the third sub-pixel B respectively include the openings 230Gh and 230Bh, each in an area corresponding to the first node N1 to which the switching TFT T2 and the storage capacitor Cst are connected, i.e., the node contact hole $CH_{node}$.

However, according to an embodiment, the first node N1 of the first sub-pixel R does not overlap the pixel electrode 230R disposed in the first sub-pixel R in a plan view, and thus the pixel electrode 230R includes no opening.

According to an embodiment, this corresponds to a layout of the pixel electrodes 230R, 230G, and 230B of the pixel P and devices of the driving circuit DC of FIG. 3 that are electrically connected to each of the pixel electrodes 230R, 230G, and 230B. At least some of the pixel electrodes 230R, 230G, and 230B have no opening.

According to an embodiment, among the parasitic capacitors Cp1, Cp2, Cp3, Cp4, Cp5, Cp6, and Cp7 generated by the overlapping conductive layers of the TFTs and capacitors in the driving circuit DC of FIG. 3, a parasitic capacitance generated between the first node N1 to which the switching TFT T2 and the storage capacitor Cst are connected and the pixel electrodes 230G and 230B has a greatest influence on current supplied to the organic light-emitting device OLED. According to an embodiment, the openings 230Gh and 230Bh are formed in the pixel electrodes 230G and 230B that overlap the first node N1 in a plan view to remove or reduce the parasitic capacitance generated between the first node N1 and the pixel electrodes 230G and.

According to an embodiment, the pixel electrodes 230G and 230B respectively disposed in the second sub-pixel G and the third sub-pixel B further include openings 230Gah and 230Bah in addition to the openings 230Gh and 230Bh overlapping the first node N1. The openings 230Gah and 230Bah are formed in locations having the greatest influence on the current supplied to the organic light-emitting device OLED.

A cross-sectional structure taken along lines VIa-VIa and VIb-VIb of FIG. 4 will be described according to a stack sequence with reference to FIG. 6 below.

Referring to FIG. 6, according to an embodiment, a buffer layer 211 is disposed over the substrate 210. The substrate 210 may include glass or plastic. The buffer layer 211 includes an inorganic material such as silicon nitride $SiN_x$ and/or silicon oxide $SiO_2$ in a single layer structure or a double layer structure. The buffer layer 211 can prevent impure atoms from penetrating into the driving circuit DC from the substrate 210 and planarizes a surface of the substrate 210. The switching TFT T2 and the storage capacitor Cst are disposed in the first area PA over the buffer layer 211.

According to an embodiment, the switching TFT T2 includes an active layer A2 disposed over the buffer layer 211 and a gate electrode G2 insulated from the active layer A2. The active layer A2 includes a channel area, a source area, and a drain area that are separated from each other with the channel area therebetween. A first insulating layer 213 is disposed between the active layer A2 and the gate electrode G2.

The active layer A2 may include various materials. According to an embodiment, the active layer A2 includes polysilicon. The source area and the drain area of the active layer A2 include impurity-doped polysilicon. The source area and the drain area are conductive due to the doping.

According to an embodiment, the gate electrode G2 includes one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer structure or a multi-layer structure. According to an embodiment, the gate electrode G2 has a single layer structure that includes molybdenum (Mo) or a triple layer structure that includes Mo/Al/Mo.

According to an embodiment, a second insulating layer 215 and a third insulating layer 217 are disposed over the first insulating layer 213 that covers the gate electrode G2. Each of the second insulating layer 215 and the third insulating layer 217 includes an inorganic material such as silicon nitride $SiN_x$ and/or silicon oxide $SiO_2$ in a single layer structure or a double layer structure. The second insulating layer 215 and the third insulating layer 217 respectively include a third opening 215$h$ and a fourth opening 217$h$ in at least the second area TA.

According to an embodiment, a drain electrode D2 of the switching TFT T2 is disposed over the second insulating layer 215 and the third insulating layer 217. The drain electrode D2 is electrically connected to the drain area of the active layer A2 through a third contact hole H3 in the second insulating layer 215 and the third insulating layer 217.

According to an embodiment, the drain electrode D2 includes one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer structure or a multi-layer structure. According to an embodiment, the drain electrode D2 has a triple layer structure that includes Mo/Al/Mo or Ti/Al/Ti.

According to an embodiment, the storage capacitor Cst is further disposed in the first area PA over the buffer layer 211, in addition to the switching TFT T2. The storage capacitor Cst includes a first electrode C1 and a second electrode C2. The first electrode C1 is disposed in the same layer as the gate electrode G2 of the switching TFT T2 and includes the same material.

According to an embodiment, the second insulating layer 215 is disposed between the first electrode C1 and the second electrode C2. The third insulating layer 217 is disposed over the second insulating layer 215 and covers the second electrode C2. That is, the second electrode C2 is disposed in different layer from the drain electrode D2 of the switching TFT T2 with the third insulating layer 217 therebetween. The drain electrode D2 and the second electrode C2 are connected to each other through the node contact hole $CH_{node}$ in the third insulating layer 217. That is, the node contact hole $CH_{node}$ corresponds to the first node N1 to which the switching TFT T2 and the storage capacitor Cst are connected. According to an embodiment, the opening 230Gh formed in the pixel electrode 230G is disposed in an area corresponding to the node contact hole $CH_{node}$. As described above, the opening 230Gh corresponding to the first node N1 is formed in the pixel electrode 230G to remove or reduce the parasitic capacitance Cp1 due to the overlapping first node N1 and pixel electrode 230G.

According to an embodiment, the upper conductive layer 260 that overlaps the opening 230Gh in the pixel electrode 230G in a plan view is a part of the drain electrode D2 of the switching TFT T2, and the lower conductive layer 270 disposed below the upper conductive layer 260 is a part of the second electrode C2 of the storage capacitor Cst.

According to an embodiment, a fourth layer 219 is disposed on the third insulating layer 217 that covers the drain electrode D2 and includes an organic material to planarize stepped differences of the driving circuit DC of FIG. 3. The fourth layer 219 includes a fifth opening 219$h$ in the second area TA.

According to an embodiment, the organic light-emitting device OLED, which includes the pixel electrode 230G, the opposite electrode 250 opposite to the pixel electrode 230G, and the intermediate layer 240 between the pixel electrode 230G and the opposite electrode 250 that includes the organic emission layer 242G, is disposed in the first area PA on the fourth insulating layer 219. The pixel electrode 230G is electrically connected to the driving TFT T1 through the via hole VIA of FIG. 4 in the fourth insulating layer 219.

According to an embodiment, both edges of the pixel electrode 230G are covered by the pixel-defining layer 220. The pixel-defining layer 220 includes the first opening 220$h$1 that exposes a part of the pixel electrode 230G and the second opening 220$h$2 in the second area TA.

According to an embodiment, the pixel electrode 230G is a reflective electrode and includes at least one reflective material selected from Ag, Mg, Al, Pt, Pd, Au, Ni, Nd, Ir, Cr, or a compound thereof. According to an embodiment, the pixel electrode 230G further includes transparent or translucent electrode layers disposed above and/or below the reflective layer.

According to an embodiment, the pixel electrode 230G included in the organic light-emitting display apparatus 2 according to an embodiment includes the at least one opening 230Gh. That is, the pixel electrode 230G includes the at least one opening 230Gh and a reflective layer completely surrounding the at least one opening 230Gh. That is, the pixel electrode 230G has a donut shape that includes the opening 230Gh therein. According to an embodiment, the opening 230Gh may have various shapes, such as a circle or a rectangle.

According to an embodiment, the opposite electrode 250 is a transparent or translucent electrode, and includes one or more materials selected from Ag, Al, Mg, Li, Ca, Cu, LiF/Ca, LiF/Al, MgAg, and CaAg. The opposite electrode 250 is electrically connected to all pixels of the organic light-emitting display apparatus 2.

According to an embodiment, the intermediate layer 240 is disposed between the pixel electrode 230G and the opposite electrode 250 and includes the organic emission layer 242G. Layers that are common in all pixels are disposed between the pixel electrode 230G and the organic emission layer 242G and between the organic emission layer 242G and the opposite electrode 250. According to an embodiment, a first common layer 241 is disposed between the pixel electrode 230G and the organic emission layer 242G and includes a hole injection layer (HIL) and/or a hole transport layer (HTL). A second common layer 243 is disposed between the organic emission layer 242G and the opposite electrode 250 and includes an electron transport layer (ETL) and/or an electron injection layer (EIL).

According to an embodiment, the first common layer 241, the second common layer 243, and the opposite electrode 250 are disposed in the first area PA and the second area TA. The first common layer 241, the second common layer 243, and the opposite electrode 250 are commonly formed for all pixels of the organic light-emitting display apparatus 2 and have a high transmittance, and thus are disposed in all areas of the organic light-emitting display apparatus 2. However, embodiments of the present disclosure are not limited thereto. That is, according to another embodiment, the opposite electrode 250 includes an opening corresponding to the second area TA.

According to an embodiment, the first common layer 241 and the second common layer 243 are not disposed in the laser drilling area LDA. The first common layer 241 and the second common layer 243 are removed by a laser-using process after being formed in the laser drilling area LDA. Thus, the auxiliary electrode 230C is connected to the opposite electrode 250 through an area from which the first common layer 241 and the second common layer 243 are removed.

According to an embodiment, the organic light-emitting display apparatuses 1 and 2 according to embodiments include the at least one openings 120h, 230Gh, and 230Bh in the pixel electrodes 130 and 230 to remove or reduce at least some parasitic capacitance generated by the overlapping of the pixel electrodes 130 and 230 with the conductive layers in the driving circuit DC.

Therefore, errors in the current supplied to the organic light-emitting device OLED can be reduced, thereby improving quality of images displayed by the organic light-emitting display apparatuses 1 and 2.

As described above, according to embodiments, by providing a pixel electrode with an opening, an organic light-emitting display apparatus can reduce the influence of a parasitic capacitor on current supplied to an organic emission element.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a pixel electrode that includes at least one opening, wherein the pixel electrode completely surrounds the at least one opening;
   an intermediate layer disposed over the pixel electrode that includes an organic emission layer;
   an opposite electrode disposed over the intermediate layer; and
   a driving circuit that includes an upper conductive layer that overlaps the at least one opening of the pixel electrode in a plan view, and that is electrically connected to the pixel electrode.

2. The organic light-emitting display apparatus of claim 1, wherein the pixel electrode is a reflective electrode, and the opposite electrode is a transparent or translucent electrode.

3. The organic light-emitting display apparatus of claim 1, wherein the pixel electrode includes a reflective layer that completely surrounds the at least one opening.

4. The organic light-emitting display apparatus of claim 1, wherein the driving circuit further includes a lower conductive layer disposed below the upper conductive layer that overlaps the at least one opening in a plan view, and
   the upper conductive layer and the lower conductive layer are electrically connected to each other.

5. The organic light-emitting display apparatus of claim 4, wherein the driving circuit further includes at least one thin film transistor (TFT) and at least one capacitor, and
   wherein the upper conductive layer and the lower conductive layer correspond to a node to which the at least one TFT and the at least one capacitor are connected.

6. The organic light-emitting display apparatus of claim 5, wherein the at least one TFT comprises:
   an active layer;
   a gate electrode disposed on the active layer and insulated from the active layer; and
   at least one of a source electrode and a drain electrode disposed on the gate electrode and electrically connected to the active layer,
   wherein the upper conductive layer is a part of one of the source electrode and the drain electrode.

7. The organic light-emitting display apparatus of claim 6, wherein the at least one capacitor comprises:
   a first electrode disposed on a same layer as the gate electrode; and
   a second electrode disposed on different layer from at least one of the source electrode and the drain electrode that is opposite to the first electrode with an insulating layer therebetween,
   wherein one of the source electrode and the drain electrode is electrically connected to the second electrode through a contact hole in the insulating layer, and the lower conductive layer is a part of the second electrode.

* * * * *